United States Patent [19]

Shirota et al.

[11] Patent Number: 5,397,723
[45] Date of Patent: Mar. 14, 1995

[54] PROCESS FOR FORMING ARRAYED FIELD EFFECT TRANSISTORS HIGHLY INTEGRATED ON SUBSTRATE

[75] Inventors: Riichiro Shirota, Kawasaki; Masaki Momodomi; Ryozo Nakayama, both of Yokohama; Seiichi Aritome, Kawasaki; Ryouhei Kirisawa, Yokohama; Tetsuro Endoh, Yokohama; Shigeyoshi Watanabe, Yokohama, all of Japan

[73] Assignee: Kabushiki Kaisha Toshiba, Kawasaki, Japan

[21] Appl. No.: 728,585

[22] Filed: Jul. 11, 1991

[30] Foreign Application Priority Data

Jul. 13, 1990 [JP] Japan ................... 2-184008
Dec. 10, 1990 [JP] Japan ................... 2-401157

[51] Int. Cl.⁶ ................ H01L 21/265; H01L 21/465
[52] U.S. Cl. .................... 437/43; 437/41; 437/48; 437/49; 437/228; 437/229; 257/316
[58] Field of Search ............... 437/228, 50, 51, 229, 437/43, 48, 49; 156/643; 257/316

[56] References Cited

U.S. PATENT DOCUMENTS

| | | | |
|---|---|---|---|
| 4,233,526 | 11/1980 | Kurug et al. | 365/184 |
| 4,574,468 | 3/1986 | Slotboom et al. | 437/228 |
| 4,619,039 | 10/1986 | Maas et al. | 437/50 |
| 4,659,428 | 4/1987 | Maas et al. | 437/228 |
| 4,694,314 | 9/1987 | Terala et al. | 365/185 |
| 4,849,369 | 7/1989 | Jeuch et al. | 437/51 |
| 4,939,690 | 7/1990 | Momodomi et al. | 365/185 |
| 5,008,856 | 4/1991 | Iwahashi | 365/185 |
| 5,013,674 | 5/1991 | Bergemont | 437/43 |
| 5,026,665 | 6/1991 | Zdebel | 437/228 |
| 5,057,462 | 10/1991 | Eisenberg et al. | 437/229 |
| 5,106,778 | 4/1992 | Hollis et al. | 156/643 |
| 5,149,666 | 9/1992 | Mikata et al. | 437/43 |
| 5,290,723 | 3/1994 | Tani et al. | 437/43 |

FOREIGN PATENT DOCUMENTS

| | | | |
|---|---|---|---|
| 0379450 | 7/1990 | France . | |
| 0134390 | 10/1981 | Japan | 365/189.05 |
| 60-62163A | 4/1985 | Japan | 437/43 |
| 63-155758 | 6/1988 | Japan . | |
| 1-158734 | 6/1989 | Japan . | |

OTHER PUBLICATIONS

IEEE Journal of Solid-State Circuits, vol. SC-17, No. 5, Oct. 1982, pp. 821-827, C. Kuo, et al., "An 80 ns 32K EEPROM Using the FETMOS Cell".

Primary Examiner—Olik Chaudhuri
Assistant Examiner—Richard A. Booth
Attorney, Agent, or Firm—Oblon, Spivak, McClelland, Maier, & Neustadt

[57] ABSTRACT

A process for forming an array of FATMOS transistors serving as memory cells of a NAND cell type EEPROM. A multi-layered structure is provided on a substrate with two stacked conductive layers insulated by an intermediate insulative layer, the first or inner conductive layer being insulated by a first insulative layer from the substrate, the second or outer conductive layer being covered with a second insulative layer. The second insulative layer is etched to define a first array of etched layer portions. A photoresist layer is deposited and etched to define a second array of layer portions, each of which is positioned between two neighboring ones of the first array of layer portions. The multi-layered structure is etched with the first and second layer portions being as a mask, to thereby form an array of a plurality of pairs of insulated gate electrodes above the substrate. A chosen impurity is doped into the substrate with the insulated gate electrodes serving as a mask to thereby form impurity-doped regions in the substrate.

12 Claims, 9 Drawing Sheets

PROCESS FOR FORMING ARRAYED FIELD EFFECT TRANSISTORS HIGHLY INTEGRATED ON SUBSTRATE

BACKGROUND OF THE INVENTION

1. Field of the Invention

The present invention relates generally to semiconductor integrated circuit devices, and more particularly to a process for forming nonvolatile programmable read-only memories including a plurality of series arrays of memory cells.

2. Description of the Related Art

Recently, in the field of programmable read-only memories (EPROMs), specific EEPROMs have been proposed which include an array of memory cells in rows and columns that are subdivided into a plurality of series circuits of memory cells in order to fulfill the ever-growing demand of further improvement in the integration density. The EPROMs of this type are called "NAND cell type EEPROMs," a typical one of which is disclosed in U.S. Pat. No. 4,939,690 to Momodomi et al. entitled "Electrically Erasable Programmable Read-Only Memory with NAND Cell Structure That Suppresses Memory Cell Threshold Voltage Variation" and assigned to the assignee of the present patent application. With the disclosed arrangement, each memory cell is constituted by only one transistor, maximizing the packing density of memory cells on a chip substrate.

There is no end to the ever-growing demand of higher integration of semiconductor memory devices. This is also true with EPROMs. In the fabrication of semiconductor memories such as EPROMs, miniaturization of device geometry has been an important goal not only to provide minimized device size, but also to improve certain device performance characteristics, such as operating speed. Particularly, in NAND cell type EEPROMs, it is a shortcut for dramatic density improvement to narrow the interval between adjoining memory cell transistors in each series array of memory cell transistors.

Unfortunately, the interval between neighboring memory cell transistors depends on the fabrication precision of the currently available patterning technique. In other words, the pitch of the memory cell transistors cannot be expected to be made narrower than the limit allowed by the existing patterning technique. The presence of any wasted space between the cell transistors is a significant impediment to the packing density improvement in the memory cells in EEPROMs. Employing a special patterning technique may improve the memory packing density at the significant risk of reducing the manufacturing yield to semiconductor manufacturers. It is therefore a general speculation that satisfying the demand of higher integration while breaking through the lowest pitch patternable with the presently available fabricating technique is substantially impossible.

SUMMARY OF THE INVENTION

It is therefore an object of the present invention to provide a new and improved process for forming an array of conductive layers aligned at a controlled interval.

It is another object of the invention to provide a new and improved process for forming programmable read-only memory devices which have an array of memory cells arranged at the minimized interval.

In accordance with the above objects, the present invention is addressed to a specific process for forming an array of a plurality of conductive layers aligned at a controlled interval therebetween. This is accomplished by first providing a conductive layer on or above a substrate with a mask layer arranged on the conductive layer. The mask is etched to define therein a first number of etched mask layer portions at a first interval defined among the etched mask layers. A second number of etched mask layer portions are then formed so that the first and second mask layer portions are alternately positioned on the conductive layer at a second interval defined between each of the first number of etched layer portions and one of the second number of etched layer portions which is adjacent thereto, the second interval being smaller than the first interval. The conductive layer is then etched using the first and second mask layer portions as a mask, thereby to form a series of conductive layer portions aligned at the second interval therebetween.

The above-described process may be modified as follows: After the mask layer is etched to define the first number of etched mask layer portions, side-wall thin-film layers are formed on both sides of each of these layer portions. Another mask layer of second chosen material is formed. The upper half portion of this mask layer is removed to cause the first number of mask layer portions with the side-wall thin-film layers to be partially exposed. The side-wall thin-film layers are then removed to define a second number of mask layer portions on the conductive layer. Then, the conductive layer is subjected to an etching process using the first and second mask layer portions as a mask, thereby forming a series of conductive layer portions on or above the substrate.

The foregoing and other objects, features, and advantages of the invention will become apparent from the following more particular description of preferred embodiments of the invention, as illustrated in the accompanying drawings.

DETAILED DESCRIPTION OF THE PREFERRED EMBODIMENTS

Figure 1A:
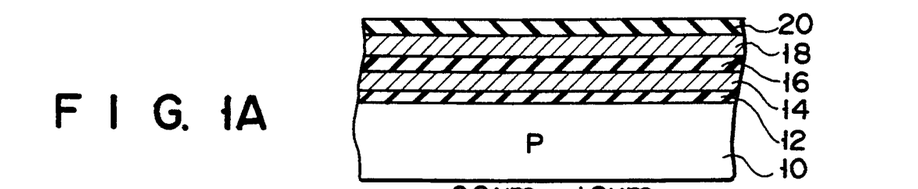
FIGS. 1A–1F illustrate, in schematic cross-section, some of the major steps in the formation of a series array of memory cell transistors of an electrically erasable programmable read-only memory (EEPROM) in accordance with one preferred embodiment of the present invention.

Referring now to FIG. 1A, there is illustrated a semiconductive substrate 10 (not drawn to scale). Substrate 10 is a chip substrate of an electrically erasable programmable read-only memory (EEPROM) having a plurality of series arrays of floating gate tunneling metal oxide field effect transistors (FATMOS) acting as memory cells; the series arrays are known as "NAND cell blocks." Substrate 10 may be silicon of an N type conductivity. Alternatively, this substrate may be P-type silicon having its top surface region doped with an N type impurity to define an N-type well region. Only for purposes of explanation, P-type silicon substrate 10 is illustrated in FIGS. 1A–1F.

After an insulating film which defines an element-formation area on the top surface of substrate 10 is formed using a well-known fabrication technique, a first gate insulating film 12 is deposited on the top substrate surface using a known thermal oxidization method. The gate insulating film 12 has a thickness on the order of 10 nanometers. A first polycrystalline silicon film 14 is then deposited on the gate insulating film 12. After grooves (invisible in FIG. 1A) are formed for isolation between floating gate electrodes extending along the word lines of the NAND cell type EEPROM, a second gate insulating film 16 is deposited on film 14. This gate insulating film 16 may be a silicon oxide thin film having a thickness of about 25 nanometers. A second polycrystalline silicon film 18 is deposited on the second gate insulating film 16. A nitride thin film 20 is formed on the film 18. This nitride film may be replaced with a CVD silicon oxide film, if required. The nitride film 20 serves as a mask layer in reactive ion etching (RIE) of the polycrystalline silicon films 14, 18, which will be performed in a later step. The resultant five-layered structure is shown in FIG. 1A.

Figure 1B:
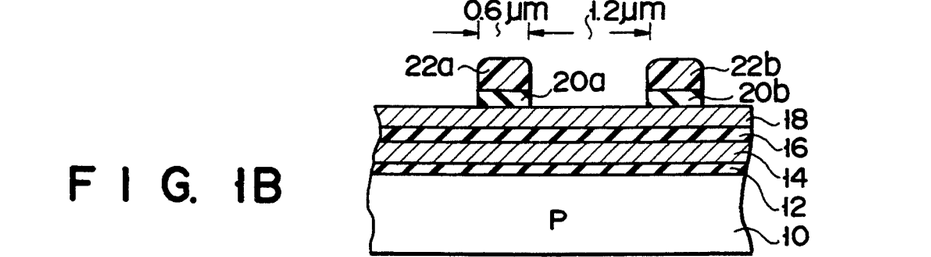

After a photoresist layer is coated all over the multi-layered structure of FIG. 1A, this layer is exposed to a chosen light to thereby define a plurality of stripe patterned layer portions 22a, 22b, . . . as shown in FIG. 1B. At this time, the underlying nitride layer 20 is likewise selectively patterned to define a plurality of patterned layer portions 20a, 20b, . . . . The patterning of these layers is conducted using the presently available photolithographic process. The interval, or the patterning pitch, between the patterned layer components 22a and 22b is naturally limited by the patterning performance in the art. In this embodiment, the pitch was set to 1.2 micrometers. The width of each patterned layer portion, or the line width, is on the submicron order; for example, 0.6 micrometer.

Figure 1C:
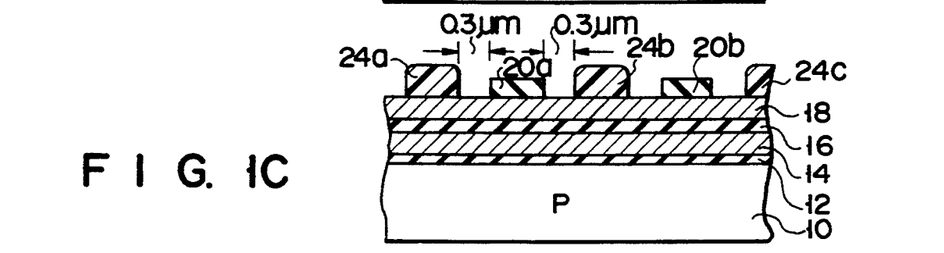

After the patterned photoresist layer portions 22a and 22b are removed, another photoresist film is deposited on the top surface of the resultant structure. This photoresist film undergoes a photolithographic process similar to the aforementioned one, thereby forming patterned layer portions 24a, 24b, 24c, . . . at 1.2-micrometer intervals on the polycrystalline silicon film 18, as shown in FIG. 1C. Very importantly, these layer portions 24 and the remaining patterned nitride layers 20a, 20b, . . . are aligned alternately. More specifically, as apparent from just viewing FIG. 1C, the patterned photoresist layer 24b is located between the previously formed nitride layers 20a, 20b, while the nitride layer 20a is positioned between the patterned photoresist layer portions 24a and 24b. The alternately-positioned layers 24a, 20a, 24b, 20b are arranged linearly from a two-dimensional viewpoint. Attention should be paid to the fact that the interval between every two neighboring layer portions, for example, layers 20a and 24b, is on the order of submicron, such as 0.3 micrometer.

Figure 1D:
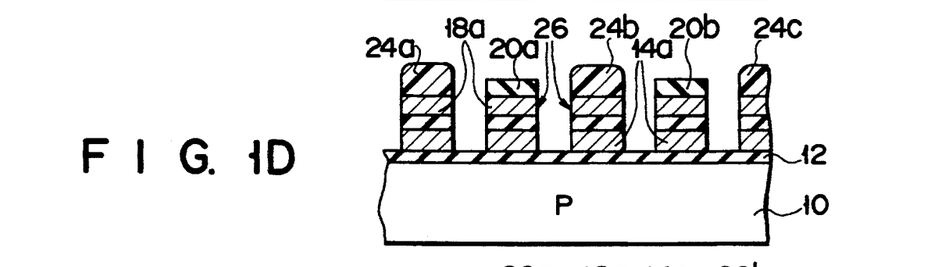

Subsequently, with the alternately-positioned nitride layers 20a, 20b and the patterned photoresist layers 24a, 24b, 24c being used as a mask, the underlying multi-layered structure is subjected to a RIE process, which is one of anisotropic etching techniques. The three stacked layers 14, 16 and 18 underlying the mask layers 20, 24 are divided into a plurality of patterned stack sections 26 having vertical walls, while the lowermost layer 12 is kept unetched as shown in FIG. 1D. The intervals between the patterned stack sections 26 are on the submicron order of about 0.3 micrometer, similarly to the case shown in FIG. 1C.

In the patterned stack sections 26 of FIG. 1D, the patterned polycrystalline silicon film 14a is precisely aligned (self-aligned) with the patterned polycrystalline silicon film 18a in the line-width direction. The patterned polycrystalline silicon film 14a underlying each section 16 acts as a floating gate electrode of one of the memory cell transistors of the NAND cell type EEPROM. The overlying polycrystalline silicon film 18a functions as a control gate electrode of the cell transistor. This will become more apparent in the following description.

Figure 1E:
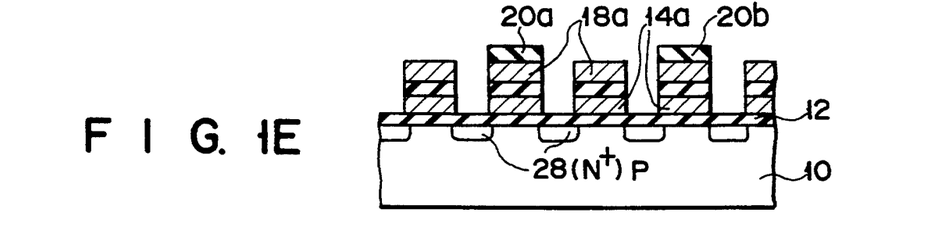

The photoresist layers 24a, 24b, 24c shown in FIG. 1D are removed. The nitride layers 20a, 20b may be left intact. An ion injection is then performed to cause the substrate to be doped with an N-type impurity. Due to the presence of the patterned stack sections 26 on substrate 10, a number of heavily-doped N-type semiconductor diffusion layers 28, which are formed in the top surface section of substrate 10 are forced to be substantially self-aligned with the previously patterned stack sections 26, as shown in FIG. 1E. Each N-type diffusion layer 28 is a current-actuable layer that is shared by two adjacent-memory cell transistors of the NAND cell type EEPROM and serves as source and drain thereof.

Figure 1F:
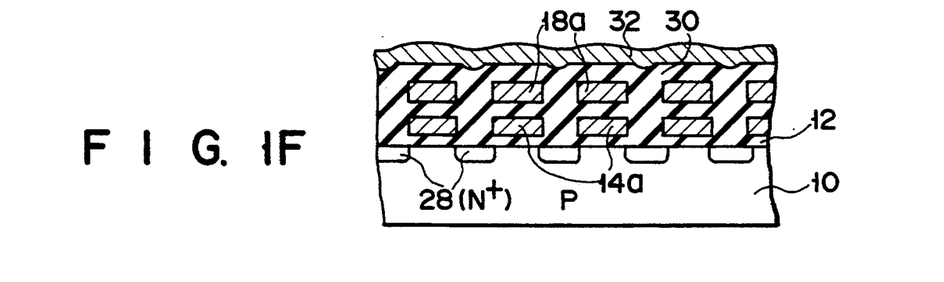

Then, as shown in FIG. 1F, a CVD insulating layer 30 is so deposited as to cover the entire surface of the resultant structure. A patterned metal layer 32 is defined on the CVD insulating layer 30. This metal layer 32 serves as a bit line BLi associated with a series array of memory cell transistors.

Figure 2:
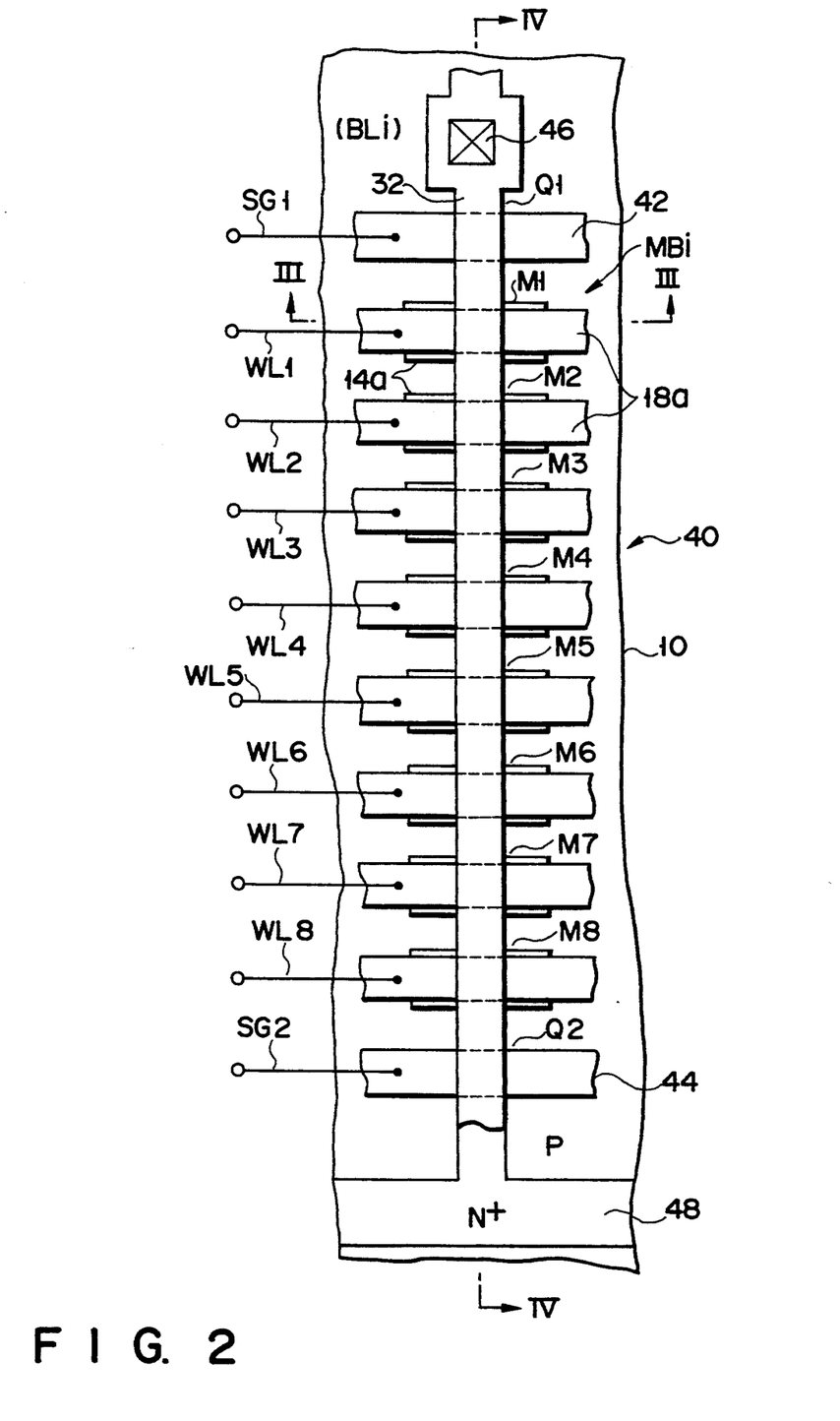
FIG. 2 is a diagram showing a plan view of the main part of a NAND cell type EEPROM that is fabricated using the process shown in FIGS. 1A–1F.

The resultant NAND cell type EEPROM fabricated using the above-described "two-step masking" technique is generally denoted by reference numeral "40" in FIG. 2. The polycrystalline silicon films 18a patterned to have a planar shape of parallel lines are arranged so as to insulatively and perpendicularly cross the metal layer 32 serving as the bit line BLi. These polycrystalline silicon films 18a serve as control gate electrodes of memory cell transistors M1, M2, . . . , M8 included in one (MBi) of multiple NAND cell blocks of the NAND EEPROM 40, while serving as word lines WL1, WL2, . . . , WL8. This can be said because each control gate electrode and the word line connected thereto are actually comprised of a physically integral wiring layer. Only for purposes of easier understanding, the floating gate electrode 14a underlying each control gate electrode 18a is illustrated a little wider in FIG. 2; however, the floating gate electrode 14a is aligned at high precision with the layer 18a as shown in FIG. 1D, 1E, or 1F.

In the plan view of FIG. 2, two additional insulated-gate field effect transistors (FETs) Q1 and Q2 are arranged on the opposite ends of the series array of FATMOS memory cell transistors M1 to M8 so as to serve as the first and second select transistors for the NAND cell block MBi. These transistors Q1, Q2 have insulated gates 42, 44 connected respectively to select-gate control lines SG1, SG2. The bit line BLi has a contact-hole portion 46 provided at its one end. A heavily-doped N type diffusion layer 48 serves as a common source connect line.

Figure 3:
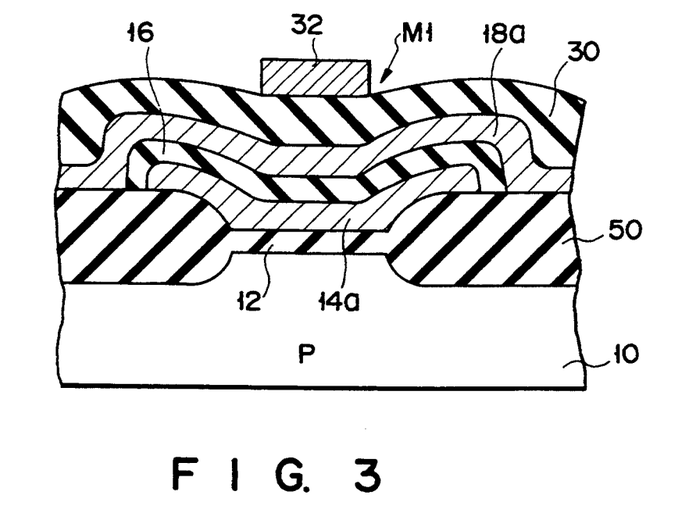
FIG. 3 is a diagram showing a cross section of the EEPROM shown in FIG. 2 along line III—III.
Figure 4:
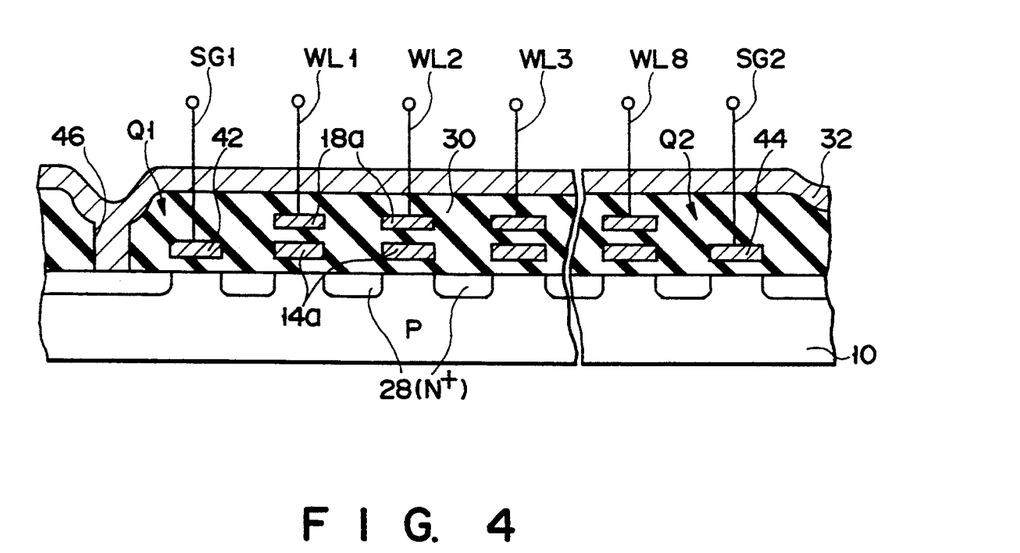
FIG. 4 is a diagram showing a cross section of the EEPROM shown in FIG. 2 along line IV—IV.

In FIG. 3 there is shown the cross-section of one of the memory cell transistors, M1, of the NAND cell block MBi of FIG. 2 taken along line III—III. An insulative layer 50 is the previously mentioned insulation layer for defining an element-formation area on the substrate surface. Only the memory cell transistor M1 may be selected by properly controlling the potentials on the bit line BLi and the word lines WL1 to WL8. Applying a suitably selected voltage to the control gate electrode 18a of the selected cell transistor M1 permits electrical carriers (electrons) to tunnel to or from the floating gate electrode 14a, thereby to cause the electrode 14a to charge or discharge. By properly assigning two different carrier storage states in the floating gate electrode 14a, i.e., the charging state and discharging state, to the states for writing a logic "1" and a "0," the desired binary information can be written in the selected cell transistor M1. The series alignment of the select transistors Q and the memory cell transistors is apparent from FIG. 4.

With the "two-step masking" technique according to the present invention as explained referring to FIG. 1, it becomes possible easily to break through the limit of the narrowest interval allowable by the currently available patterning process, without employing any special risky technique. If the technique is applied to the formation of a series array of FATMOS memory cell transistors M1 to M8 of the NAND cell type EEPROM 40, the intervals between these cell transistors, i.e., the intervals between neighboring floating gate electrodes or the intervals between adjacent control gate electrodes (word lines), can be reduced to the submicron order of about 0.3 micrometer, when the electrode width is 0.6 micrometer. In this typical case, the NAND cell pitch may be 0.9 micrometer. Therefore, it is possible to fabricate NAND cell type EEPROMs with higher integration density using the presently available fabrication techniques while maintaining a high manufacturing yield. This will provide the semiconductor manufacturers with significant advantages.

Figure 5A:
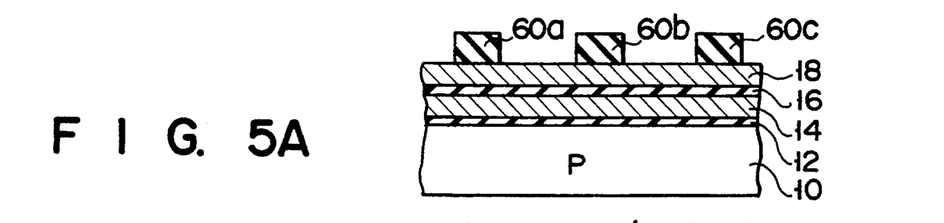
FIGS. 5A–5F illustrate, in schematic cross-section, some of the major steps in the formation of a series array of memory cell transistors of an electrically erasable programmable read-only memory in accordance with another embodiment of the present invention.

The manufacturing process in accordance with another embodiment of the present invention will now be described with reference to FIG. 5. Layers 12, 14, 16, and 18 are sequentially formed on the top surface of a silicon substrate 10 of the P type conductivity using a similar process to that of the previously explained embodiment. A silicon-nitride film 60 is deposited on polycrystalline silicon film 18, and then subjected to a patterning process, to obtain patterned nitride film components 60a, 60b, 60c as shown in FIG. 5A.

Subsequently, insulation layers 62 are formed on both side walls of each of patterned nitride layers 60a, 60b, 60c. These side-wall insulation layers 62 may be fabricated as follows: A silicon oxide thin film is first deposited, using the known CVD method, to a predetermined thickness, typically 0.2 micrometer on the top surface of the structure of FIG. 5A; then, a reactive ion etching (RIE) process is performed so that, while etched layer components 62 are left on both side walls of each nitride thin film 60, the remaining portions of the silicon oxide thin film are removed away. Since the thickness of these side-wall insulation layers 62 is 0.2 micrometer, the width of such side-wall structure is 1.0 micrometer when the line width of each layer 60 is 0.6 micrometer. The side-wall insulation layers 62 will be referred to as the "spacer layers."

Figure 5B:
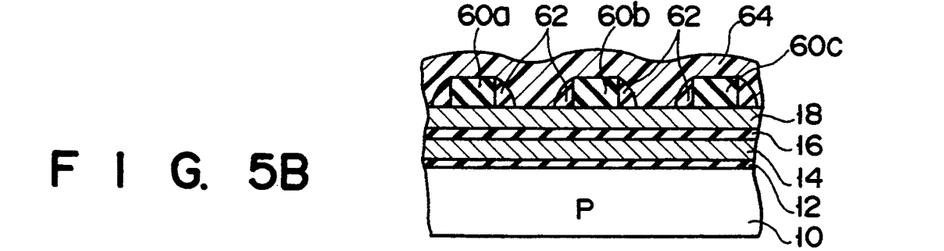
Figure 5C:
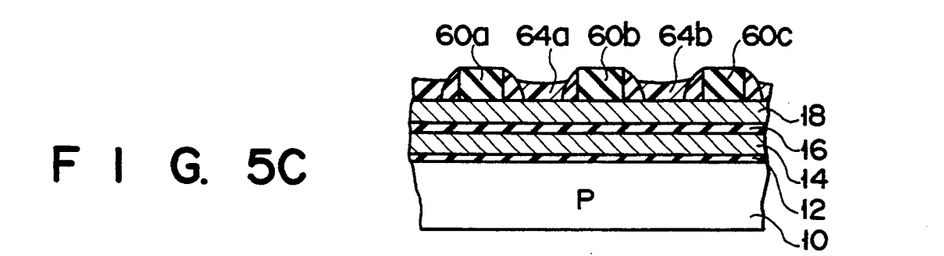

After formation of the spacer layers 62, the overall top surface of the resultant structure is covered by a photoresist layer 64 as shown in FIG. 5B. Photoresist layer 64 is then subjected to a photolithographic process, such as the RIE. The upper half portion of photoresist layer 64 is removed with the result that the nitride layers 60, each of which has spacer oxide layers 62 on the both sides thereof, are exposed at their top portions as shown in FIG. 5C. Etched photoresist layers 64a, 64b are 0.6 micrometer-thick.

Figure 5D:
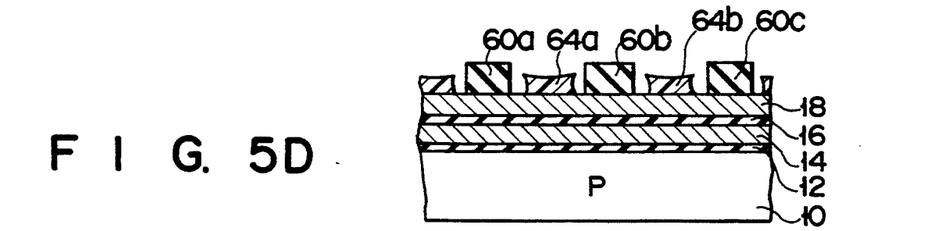
Figure 5E:
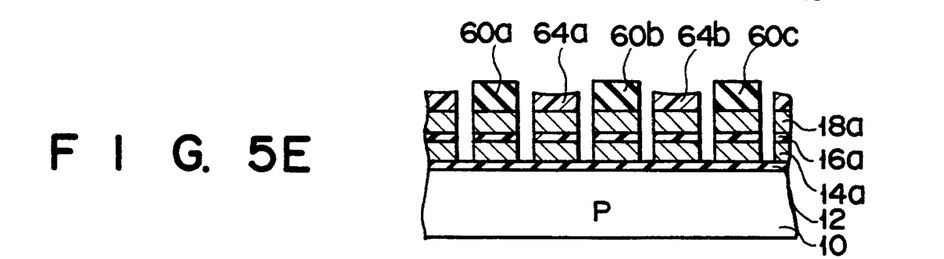

Then, a selective etching process is carried out using a chosen etchant, for example NH4F, such that only the side-wall oxide thin films 62 are removed away to obtain a structure shown in FIG. 5D, wherein the patterned nitride layers 60a, 60b, 60c and the etched photoresist layers 64a, 64b are alternately positioned on the polycrystalline silicon 18. The spatial interval between them is reduced to 0.2 micrometer. By using these layers 60, 64 as an etching mask, the underlying stacked layers 14, 16, 18 are etched in a similar manner to that shown in FIG. 1D. For example, the RIE process is a recommendable method to be employed in this case. Here, the etched layers 14a, 16a, 18a may be obtained as shown in FIG. 5E.

Figure 5F:
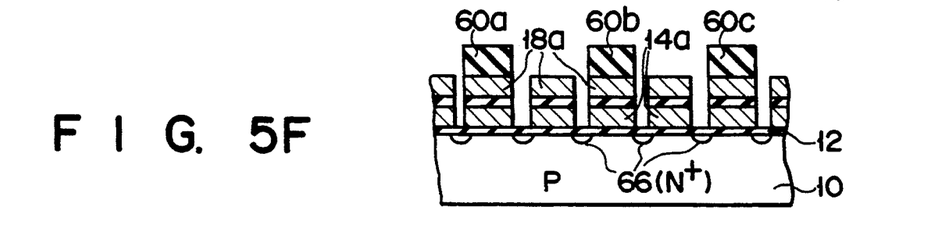

After the photoresist mask layers 64 are removed, the substrate 10 is doped with an N-type impurity using a similar technique to that in FIG. 1E. As a result, as shown in FIG. 5F, heavily-doped N type diffusion layers 66 are formed in P-type substrate 10 to a specific width of 0.2 micrometer. The following processes are similar to the case shown in FIG. 1F.

With the above mentioned technique of "patterning fabrication using side-wall spacer," it becomes possible to cause the interval or distance between the gate electrodes of neighboring FATMOS memory cell transistors to be dramatically reduced to 0.2 micrometer in NAND cell type EEPROMs, without employing any special fabrication processes. Therefore, the series arrays of FATMOS cell transistors can be miniaturized to maximize the integration density of the EEPROMs with the use of presently available patterning technology.

Figure 6:
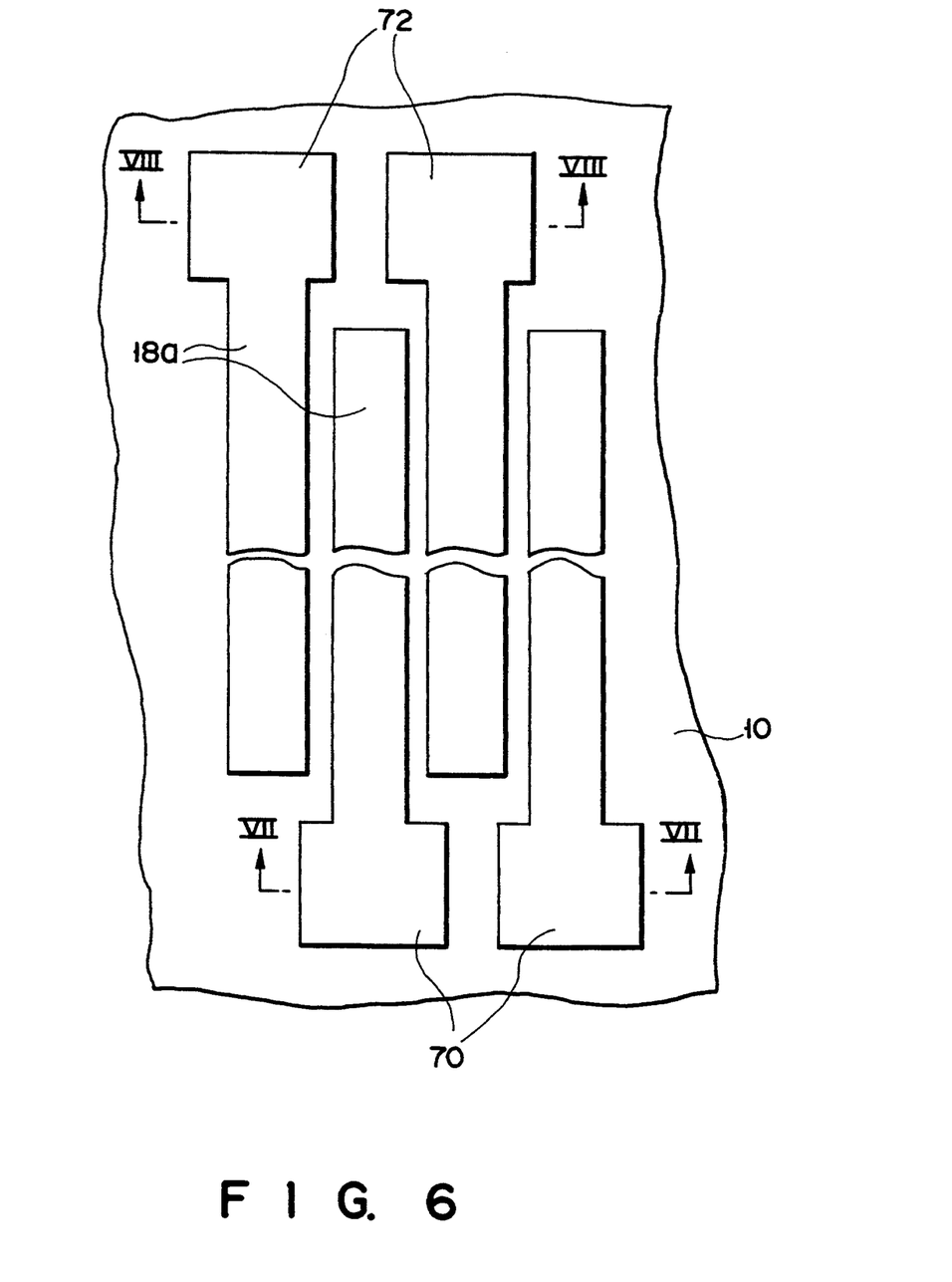
FIG. 6 is a diagram showing a plan view of the resultant EEPROM chip.

During the fabrication of the FATMOS memory cell transistor array of the NAND cell type EEPROM shown in FIGS. 5A through 5F, the following manufacturing process will be performed in a peripheral section of this cell array and a peripheral circuit section of the EEPROM. The plan view of word lines in the EE- PROM is schematically illustrated in FIG. 6. These word lines may be assumed to be the previously described patterned polycrystalline silicon thin films 18a. The word lines have contact portions 70, 72 at the opposite end sections thereof, as shown in FIG. 6.

As apparent from viewing FIG. 6, the patterning formation pitch at the word line contact portions 70, 72 is so arranged that it is greater than that in the central area of the memory cell array. In other words, the patterning pitch at contact portions 70, 72 is within a normal patterning limit of the existing manufacturing technology. The fabrication process in this area is as shown in FIGS. 7 and 8.

Figure 7A:
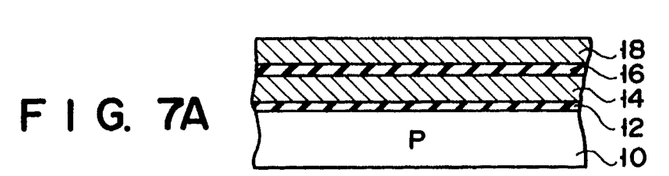
FIGS. 7A–7D illustrate, in schematic cross-section, some of the major steps in the formation of contact sections of word lines associated with the memory cell transistor.
Figure 7B:
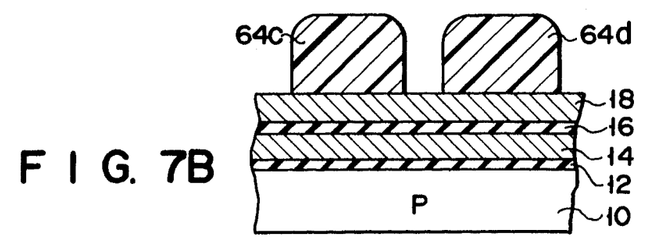
Figure 8A:
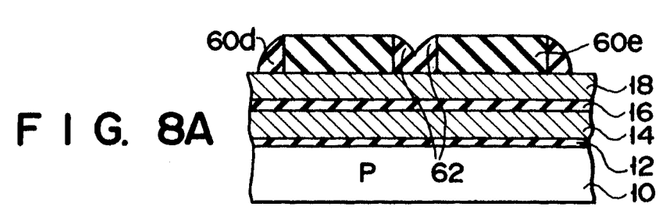
FIGS. 8A–8D illustrate, in schematic cross-section, some of the major steps in the formation of the opposite contact sections of the word lines associated with the memory cell transistor.
Figure 8B:
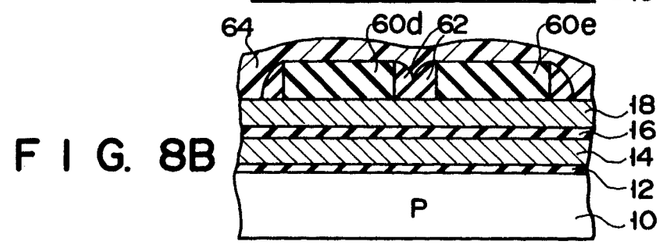

A photoresist layer 64 is formed on the multilayered structure of layers 12, 14, 16 of FIG. 7A. This photoresist layer is the same as the layer 64 of FIG. 5B. Before layer 64 is RIE-etched so as to expose the top surface portions of the side-wall structure sections in the process of FIG. 5C, the contact sections 70 have been subjected to the following process: The photoresist layer 64 is patterned using a known photolithographic technique as shown in FIG. 7B. At this time, in the other contact portions 72, patterned nitride layers 60d, 60e are defined as shown in FIG. 8A. The two neighboring ones of the spacer layers 62 which are "adhered" to both side walls of each layer 60d, 60e are in direct contact with each other. The above photoresist layer 64 entirely covers these spacer layers. While photoresist layer 64 is being processed as shown in FIG. 7B, this layer is forced to remain as a coverage layer for layers 60d, 60e, 62 in the contact portions 72 as apparent from FIG. 8B. If desired, photoresist layer of FIG. 8B may be removed in this step of the manufacturing process.

Figure 7C:
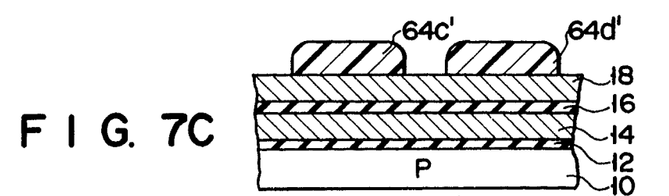
Figure 8C:
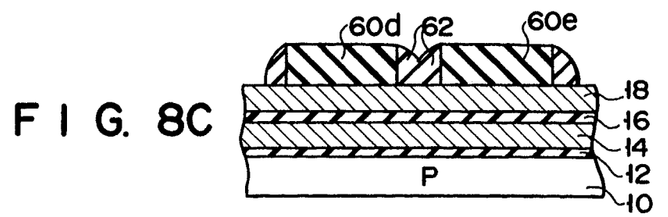

When the etching fabrication for the photoresist layer 64 is terminated in the step of FIG. 5C, photoresist layer components 64c, 64d are made thinner as shown by "64c'" and "64d'" in FIG. 7C in the contact sections 70. In the other contact portions 72, photoresist layer 64 has been completely removed away as shown in FIG. 8C.

Figure 7D:
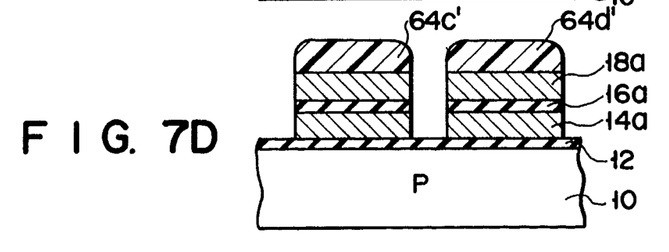
Figure 8D:
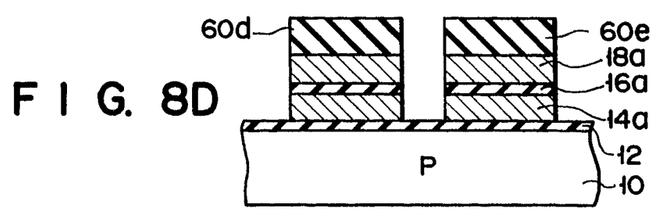
Figure 9A:
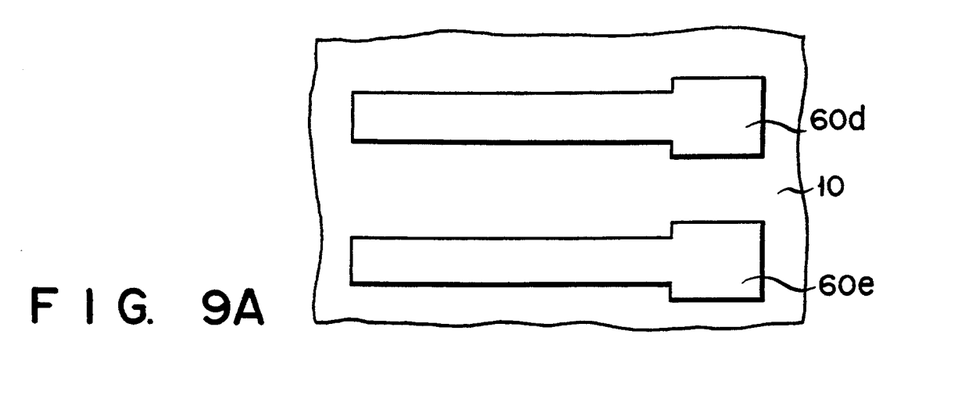
FIGS. 9A–9E illustrate, in schematic plan views, some of the major steps in the formation of the opposite contact sections of the word lines associated with the memory cell transistor shown FIGS. 7 and 8.
Figure 9B:
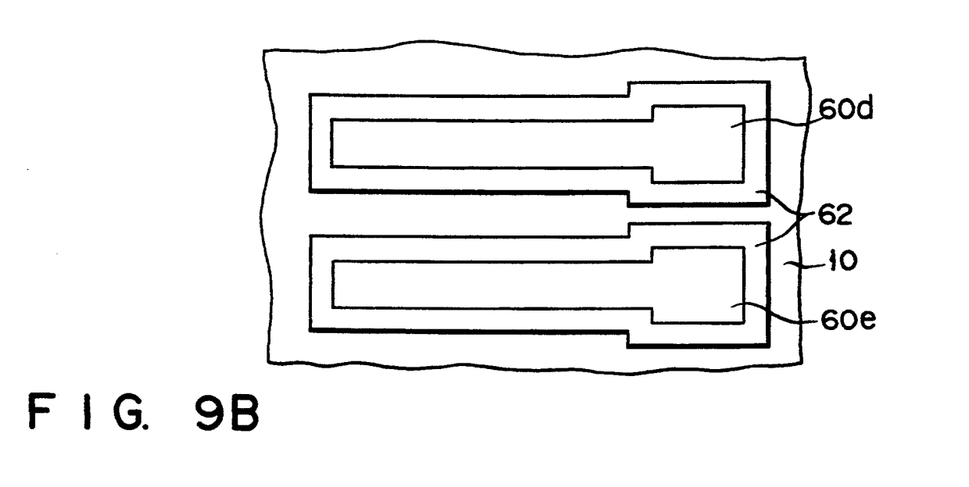
Figure 9C:
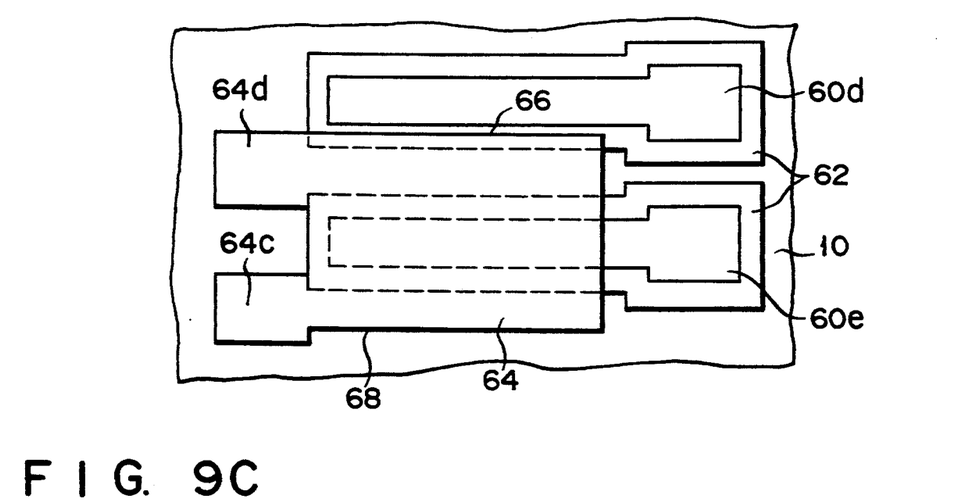
Figure 9D:
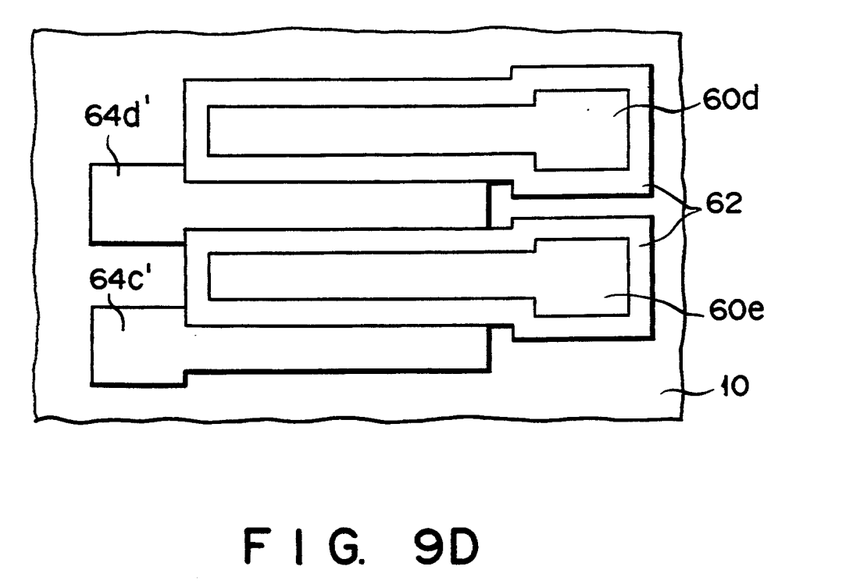
Figure 9E:
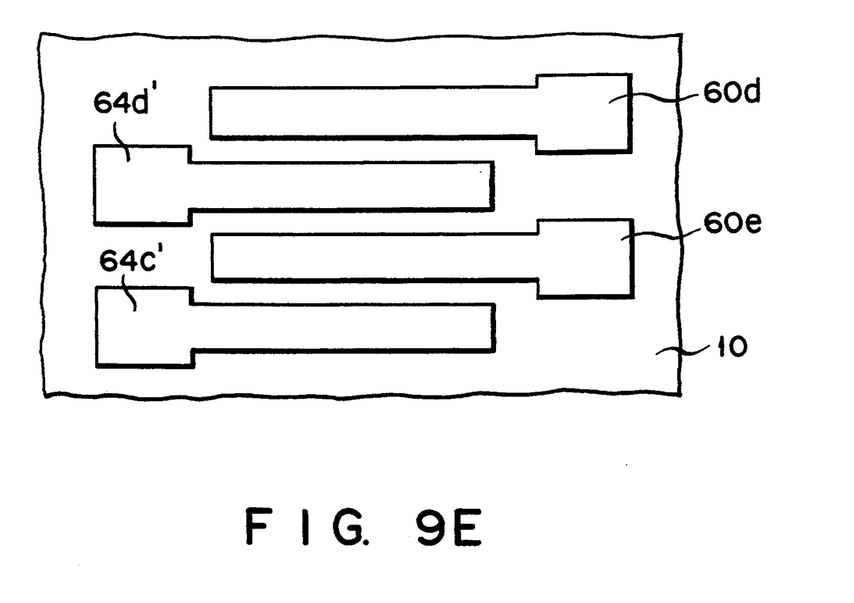

During the RIE-etching process for the stacked layers 14, 16, 18 in the memory cell array section of the NAND cell EEPROM shown in FIG. 5E, the contact portions 70 are subjected to the following process: layers 14, 16, 18 are similarly patterning-fabricated with layers 64c' and 64d' being as a mask, as shown in FIG. 7D. With respect to the other contact portions 72, layers 14, 16, 18 are patterned similarly by using the layers 60d, 60e, from which spacer layers 62 have been removed, as a mask therefor as shown in FIG. 8D. Therefore, during formation of the FATMOS memory cell transistors at decreased patterning pitch in the memory cell array section, the patterning process for the peripheral sections of memory cell array can also be successfully executed without employing any extra manufacturing techniques.

Some major plan views of the structures obtained in the above steps of the formation of the opposite contact sections are illustrated in FIGS. 9A through 9E. It is to be understood from FIG. 9C that the patterning shape of the previously described photoresist layer 64 is determined to define components 64c, 64d in one contact region. One side edge line 66 of layer 64 is formed to be positioned above a corresponding linear portion of the spacer layer 62. The positioning of line 66 may be easily made using an existing photolithographic process, rather than a self-alignment process. The opposite edge line 68 of layer 64 is defined by the etching process in the step of FIG. 9C. This line has a step-like shape so as to represent the side edge line of the last-stage one of the patterned electrode layers with contact portions associated therewith.

The additional advantages of the manufacturing method in accordance with the present invention are as follows. In the series of steps of manufacturing process shown in FIG. 5, the patterned interval, or patterning pitch, of the memory cell transistors may correspond essentially to the deposition thickness of the side-wall spacer oxide layers 62; principally, as this thickness is decreased, the patterning pitch of cell transistors can be reduced even further. With the presently available manufacturing technology, it is very easy to decrease the deposition thickness of spacer layers 62 up to 50 nanometers or less. If this is the case, the patterning pitch of cell transistors can be easily reduced to 50 nanometers. It should be noted in this case that the N-type diffusion layers of FIG. 5F serving as the sources and drains shared by these cell transistors may be omitted if desired. Even in such arrangement, the resultant NAND cell array without sources and drains can operate normally. This can be said because a control voltage that is applied to a selected bit line BLi in either a write or a read mode can be transferred to a selected memory cell transistor through the channel regions of the non-selected cell transistors in the same NAND cell array. If no sources and drains are provided in the NAND cell array, the net channel length of the memory cell transistors and the select gates can become equal at high precision to the gate length of the cell transistors. This enables the operating efficiency of the NAND cell EEPROM to be improved.

Figure 10A:
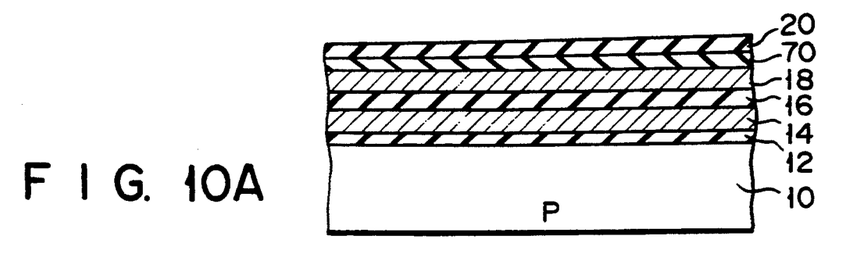
FIGS. 10A–10E illustrate, in schematic cross-section, some of the major steps in the formation of a series array of memory cell transistors of an EEPROM in accordance with a still another embodiment of the present invention.
Figure 10B:
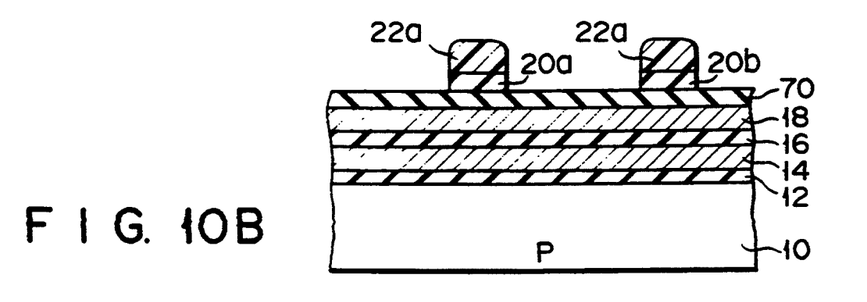
Figure 10C:
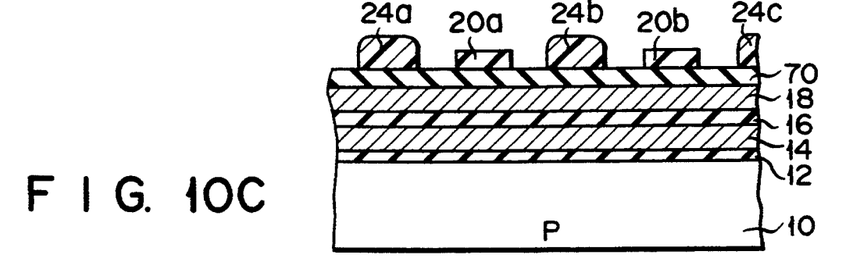

A still further embodiment of the invention is shown in FIG. 10, wherein an additional mask layer 70 is deposited such that it is sandwiched between the second polycrystalline silicon film 18 and the nitride layer 20, as shown in FIG. 10A. Mask layer 70 may be a polycrystalline silicon carbide layer. The processes for etching the layer 20 and forming layer components 20a, 20b, 24a, 24b, 24c are similar to those shown in FIGS. 1B and 1C.

Figure 10D:
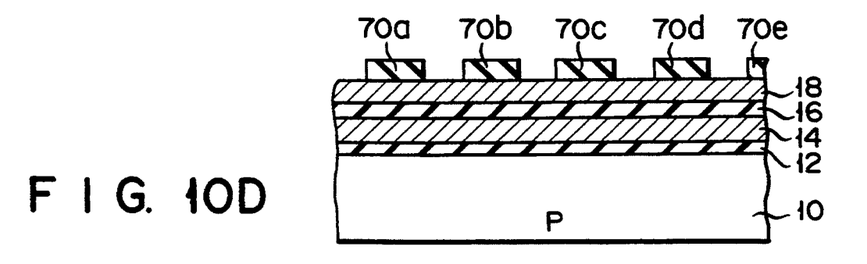
Figure 10E:
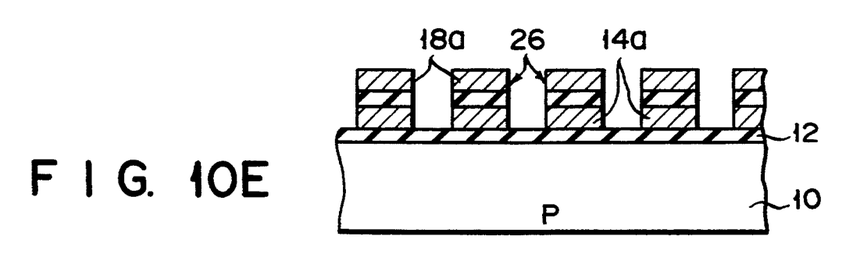

Then, as shown in FIG. 10D, the additional mask layer 70 is subjected to a patterning process with the etched layer components 20a, 20b, 24a, 24b, 24c functioning as a mask. The patterned mask layer portions 70a to 70e are thus defined on layer 18. By using these layer portions 70a as a mask, a lithographic patterning process is performed, thereby to obtain a plurality of patterned stack sections 26, which is similar to that shown in FIG. 1D. The resultant structure will be subjected to a process similar to that of FIG. 1F, so that a similar NAND cell type EEPROM may be completed.

With the use of the carbide mask layer, the etching-tolerance characteristic can be enhanced. This can improve the etching-performance; therefore, the manufacturing efficiency can be improved even when the layer structure to be etched increases in thickness.

The present invention is not limited to the above-described specific embodiments and may be practiced or embodied in still other ways without departing from the spirit or essential character thereof. For example, the previously explained fabrication techniques may also be applied to formation of other types of semiconductor IC devices having narrowed patterning pitches among conductive lines including control gates.

What is claimed is:

1. A process for forming an array of conductive layers having a controlled interval therebetween, said process comprising the steps of:

providing at least one conductive layer on or above a substrate with a mask layer of a first material being arranged on said conductive layer;

etching said mask layer to define therein first etched mask layer portions having a first interval therebetween;

forming sidewall thin film layers in contact with both sides of each of said first etched mask layer portions on said conductive layer;

forming a further mask layer of a second material;

removing an upper portion of said further mask layer to cause the first mask layer portions with said sidewall thin film layers to be partially exposed;

removing said sidewall thin film layers to thereby form second mask layer portions on said conductive layer; and etching said conductive layer using the first and second mask layer portions to thereby form a series of conductive layer portions on or above said substrate.

2. A process according to claim 1, wherein said sidewall thin film layers are deposited to have a thickness less than one micron, which corresponds to an interval of neighboring ones of said conductive layer portions.

3. A process according to claim 2, further comprising the step of:

doping semiconductor impurity of a conductivity type that is opposite to that of said substrate with said conductive layer portions serving as a mask structure, whereby impurity-doped regions are formed in said substrate so that these regions are substantially self-aligned with said conductive layer portions.

4. A process according to claim 2, wherein said at least one conductive layer comprises first and second insulated polycrystalline semiconductor layers formed insulatively above said substrate as, the first and second semiconductor layers being subjected to the etching process, whereby a series of insulatively stacked semiconductor layer portions are formed above said substrate.

5. A process according to claim 4, wherein said series of insulatively stacked semiconductor layer portions thus etched are substantially uniform in width.

6. The process according to claim 5, wherein said first material is selected from the group consisting of silicon nitride, silicon oxide and silicon carbide, whereas said second material includes a radiation-sensitive resist material.

7. A method for forming an array of floating gate field effect transistors on a semiconductive substrate comprising the steps of:

providing a multi-layered structure on said substrate with two conductive layers insulatively stacked by an intermediate insulative layer, the first or inner conductive layer being insulated by a first insulative layer from said substrate, the second or outer conductive layer being covered with a second insulative layer;

etching said second insulative layer to define therein a first array of etched layer portions;

forming insulative thin film layers on both side walls of said etched layer portions;

depositing a radiation-sensitive resist material on the top surface of the resultant structure;

etching said resist material so that said etched layer portions with said thin film layers are partially exposed;

removing said thin film layers to thereby define a second array of layer portions each of which is positioned between two neighboring ones of said first array of layer portions;

etching said multi-layered structure with the first and second layer portions serving as a mask to thereby form an array of pairs of insulated gate electrodes above said substrate; and doping semiconductor impurity into said substrate with said plurality of insulated gate electrodes serving as a mask to thereby form impurity-doped regions in said substrate.

8. A method according to claim 7, wherein said two conductive layers insulatively stacked in said multi-layered structure comprise semiconductor polycrystalline layers.

9. A method according to claim 8, wherein said impurity-doped regions are different in conductivity type from said substrate.

10. A method according to claim 8, wherein said resist material is etched so as to also define contact sections associated with said second array of layer portions, said material having a step-like edge line which defines a side edge line of a end electrode of said array of pairs of insulated gate electrodes.

11. A method for forming an array of field effect transistors on a semiconductive substrate comprising the steps of:

providing a multi-layered structure on said substrate with two conductive layers insulatively stacked by an intermediate insulative layer, the first or inner conductive layer being insulated from said substrate by a first insulative layer, the second or outer conductive layer being covered with a second insulative layer;

etching said second insulative layer to define therein a first array of etched layer portions;

forming insulative thin film layers on both side walls of said etched layer portions;

depositing a radiation-sensitive resist material on the top surface of the resultant structure;

etching said resist material so that said etched layer portions with said thin film layers are partially exposed;

removing said thin film layers to thereby define a second array of said etched layer portions each of which is positioned between two neighboring ones of said first array of layer portions; etching said multi-layered structure with the first and second array of etched layer portions serving as a mask to thereby form an array of a plurality of pairs of insulated gate electrodes above said substrate; and completing formation of said array of field effect transistors without the formation of impurity-doped semiconductor regions in said substrate.

12. A method for forming an array of field effect transistors on a semiconductor substrate, comprising the steps of:

forming said semiconductor substrate;

forming a first insulating layer on said substrate;

forming a first conductive layer on said first insulating layer;

forming a second insulating layer on said first conductive layer;

forming a second conductive layer on said second insulating layer;

forming a third insulating layer on said second conductive layer;

etching said third insulating layer to form a first array of etched layer portions;

forming insulative thin film layers on opposite side portions of said etched layer portions;

depositing a radiation-sensitive resist material on the top surface of the resulting structure;

etching said resist material so that said etched layer portions with said thin film layers are partially exposed;

removing said thin film layers to thereby define a second array of etched layer portions each of which is positioned between two adjacent portions of said first array of etched layer portions;

etching said multi-layered structure with said first and second arrays of etched layer portions serving as a mask to thereby form an array of a plurality of pairs of insulated gate electrodes above said substrate; and completing formation of said array of field effect transistors without the formation of impurity-doped semiconductor regions in said substrate.

* * * * *